(12) United States Patent
Nagai et al.

(10) Patent No.: US 7,504,341 B2
(45) Date of Patent: Mar. 17, 2009

(54) METHOD OF MANUFACTURING A SEMICONDUCTOR APPARATUS USING A SUBSTRATE PROCESSING AGENT

(75) Inventors: Kouichi Nagai, Kawasaki (JP); Hideyuki Kanemitsu, Kawasaki (JP)

(73) Assignee: Fujitsu Microelectronics Limited, Tokyo (JP)

( * ) Notice: Subject to any disclaimer, the term of this patent is extended or adjusted under 35 U.S.C. 154(b) by 934 days.

(21) Appl. No.: 10/360,875

(22) Filed: Feb. 10, 2003

(65) Prior Publication Data

US 2004/0038531 A1 Feb. 26, 2004

(30) Foreign Application Priority Data

Aug. 22, 2002 (JP) ............................. 2002-242075

(51) Int. Cl.
*H01L 21/302* (2006.01)

(52) U.S. Cl. .................. 438/706; 438/723; 430/18; 430/191

(58) Field of Classification Search ............ 438/706, 438/710, 723, 724, 725, 712; 430/18, 191, 430/193
See application file for complete search history.

(56) References Cited

U.S. PATENT DOCUMENTS

| | | | |
|---|---|---|---|
| 5,350,485 A * | 9/1994 | Shiraishi et al. | 216/13 |
| 5,518,579 A | 5/1996 | Katsuyama et al. | |
| 6,190,833 B1 * | 2/2001 | Shiota et al. | 430/280.1 |
| 6,329,110 B1 * | 12/2001 | Nunomura et al. | 430/18 |
| 6,340,557 B1 * | 1/2002 | Shimomura | 430/316 |
| 6,506,534 B1 * | 1/2003 | Nozaki et al. | 430/270.1 |
| 6,514,658 B2 * | 2/2003 | Nunomura et al. | 430/191 |
| 6,653,052 B2 * | 11/2003 | Tanaka et al. | 430/311 |
| 6,770,417 B2 | 8/2004 | Nozaki et al. | |

FOREIGN PATENT DOCUMENTS

| | | |
|---|---|---|
| JP | 07-057995 | 3/1995 |
| JP | 7-249572 | 9/1995 |
| JP | 11-153872 | 6/1999 |
| JP | 11-231544 | 8/1999 |
| JP | 2000-89454 | 3/2000 |
| JP | 2002-148805 | 5/2002 |
| WO | WO99/15935 | 4/1999 |

OTHER PUBLICATIONS

Iwanami Dictionary of Physics and Chemistry 5th Edition, Feb. 20, 1998, "Trifluoromethanesulfonic acid".
Japanese Office Action dated Apr. 10, 2007, Application No. 2002-242075.

* cited by examiner

*Primary Examiner*—Kin-Chan Chen
(74) *Attorney, Agent, or Firm*—Westerman, Hattori, Daniels & Adrian, LLP.

(57) ABSTRACT

A method of manufacturing a semiconductor device, including the steps of forming one or more insulation films over a substrate, said one or more insulation films including an insulation film at a top thereof, coating the insulation film with a substrate processing agent, providing resist onto the insulation film coated with the substrate processing agent, lithographically forming a pattern of the resist, and dry-etching the insulation film by using the resist as a mask, wherein the substrate processing agent contains at least a solvent and an acid generating agent.

33 Claims, 11 Drawing Sheets

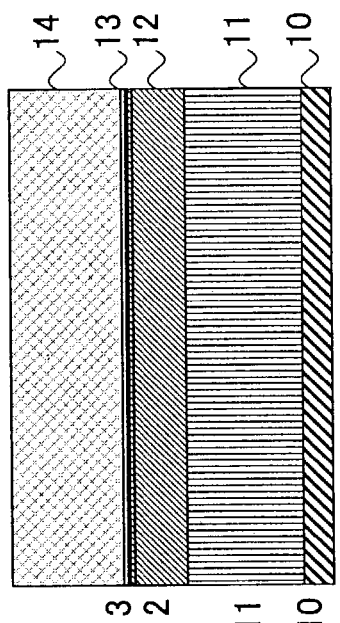
FIG.2A
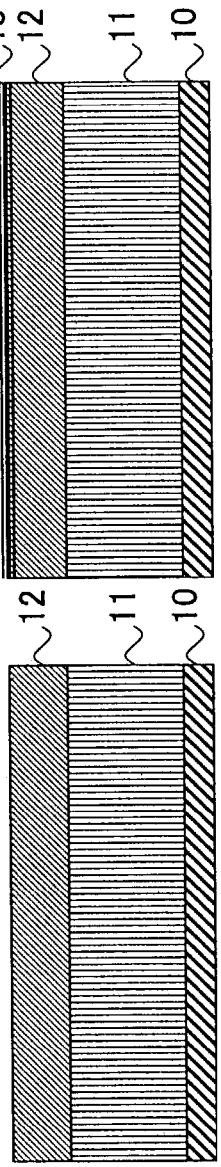
FIG.2B
FIG.2C
FIG.2D
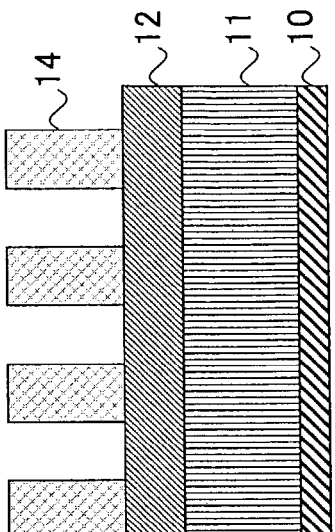
FIG.2E
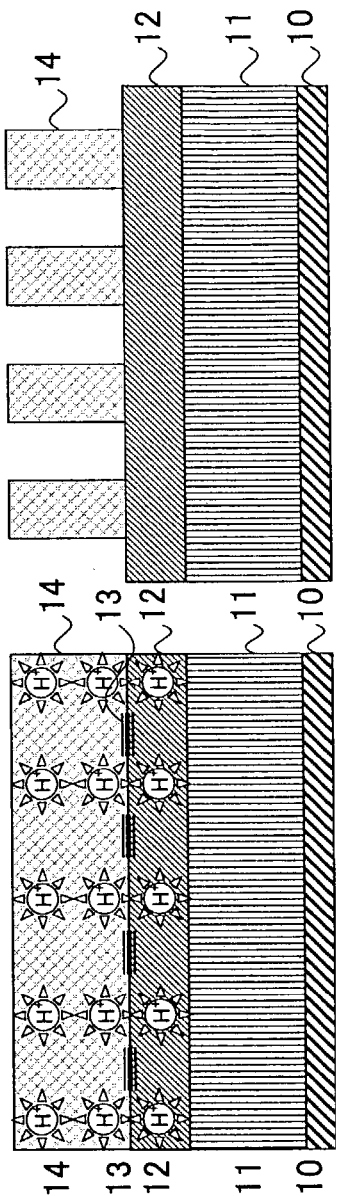
FIG.2F
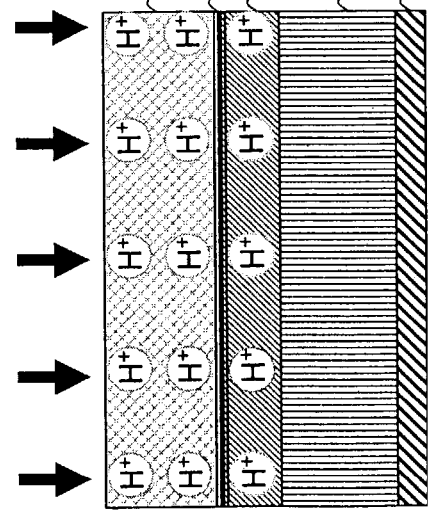

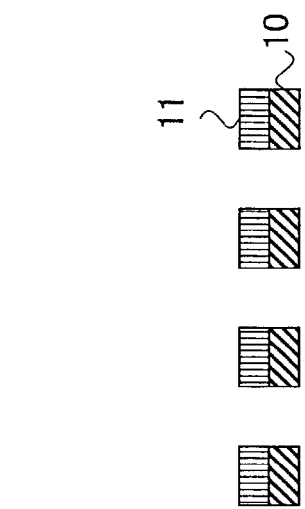
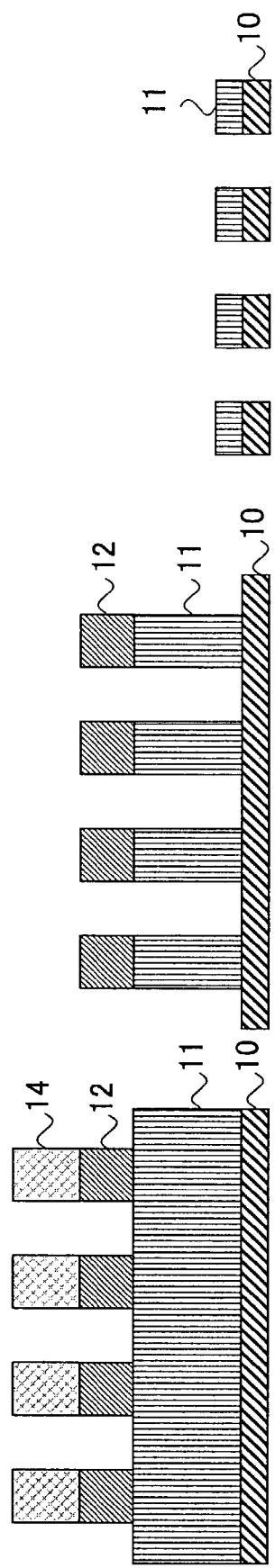

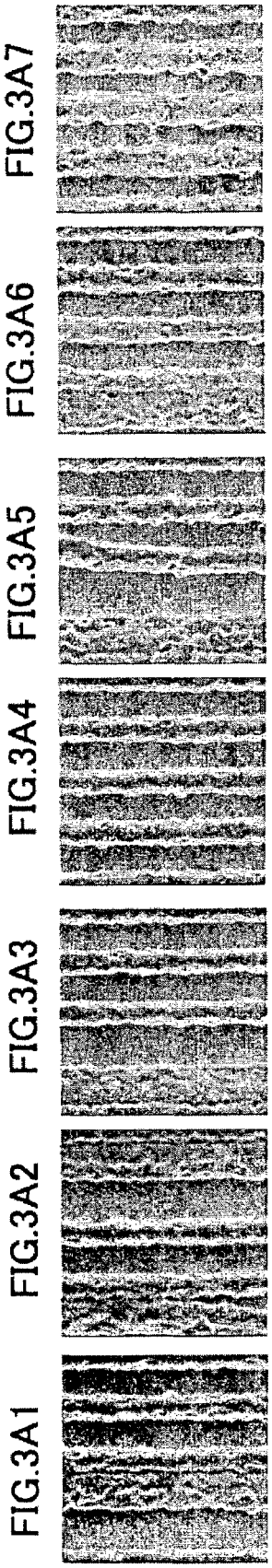
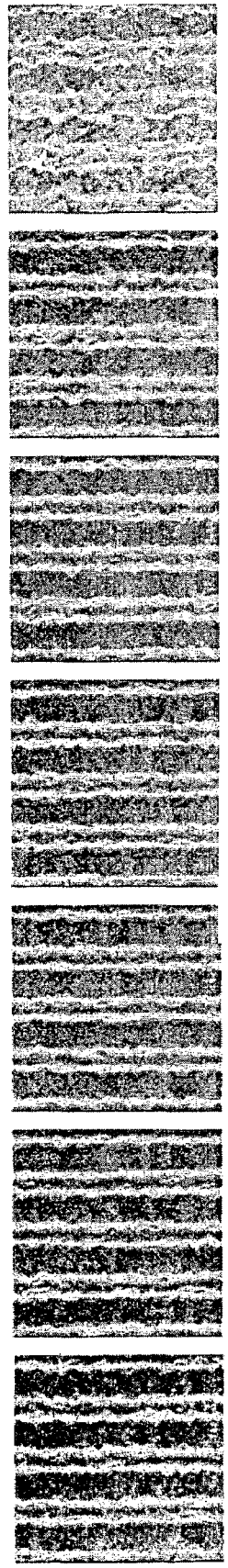
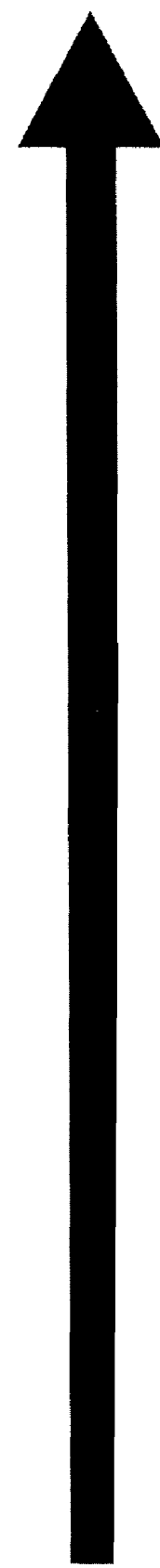
Focus
Step 0.1 μ

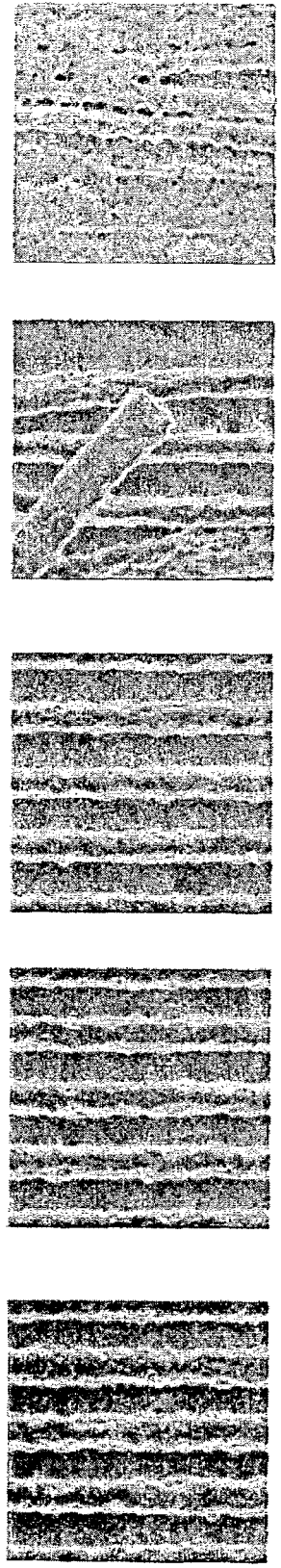
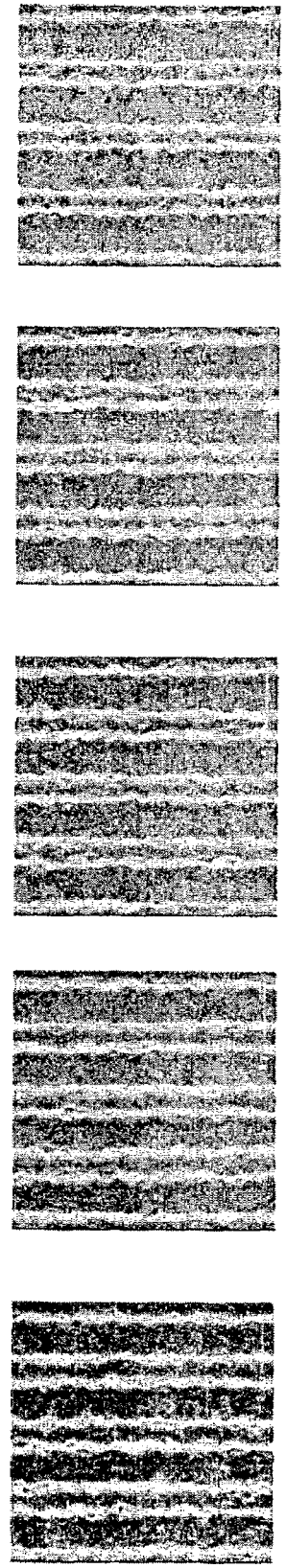
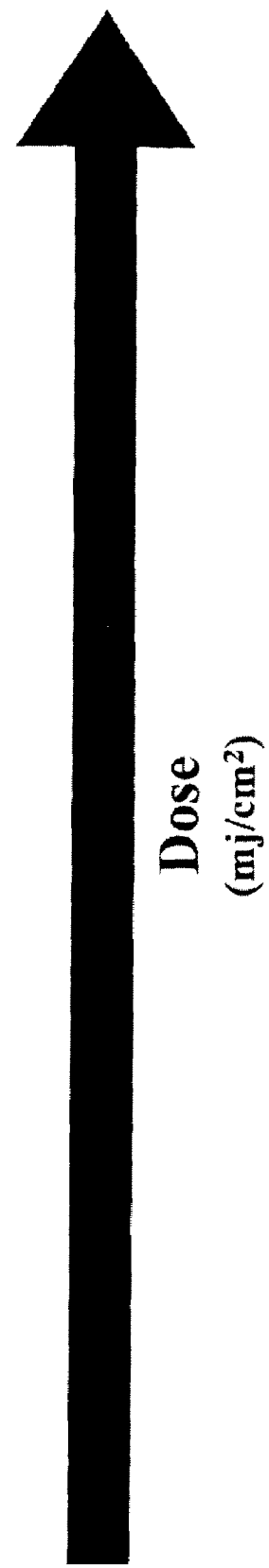
FIG.4A1 FIG.4A2 FIG.4A3 FIG.4A4 FIG.4A5
FIG.4B1 FIG.4B2 FIG.4B3 FIG.4B4 FIG.4B5
Dose (mj/cm²)

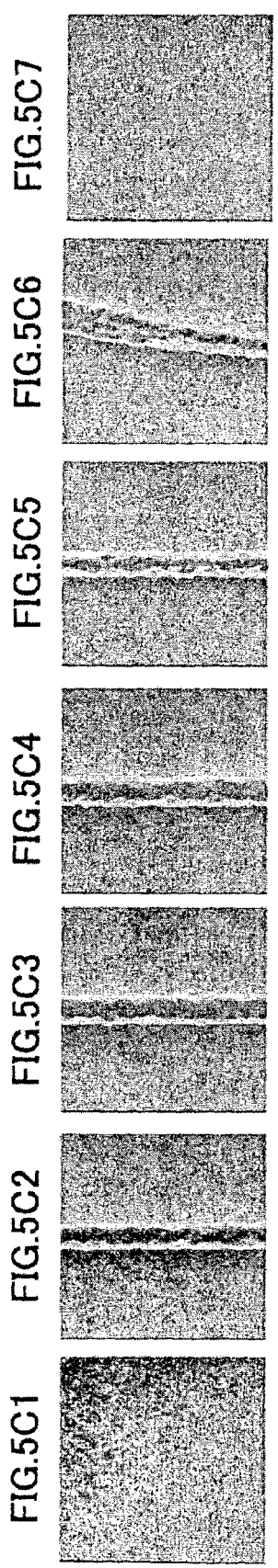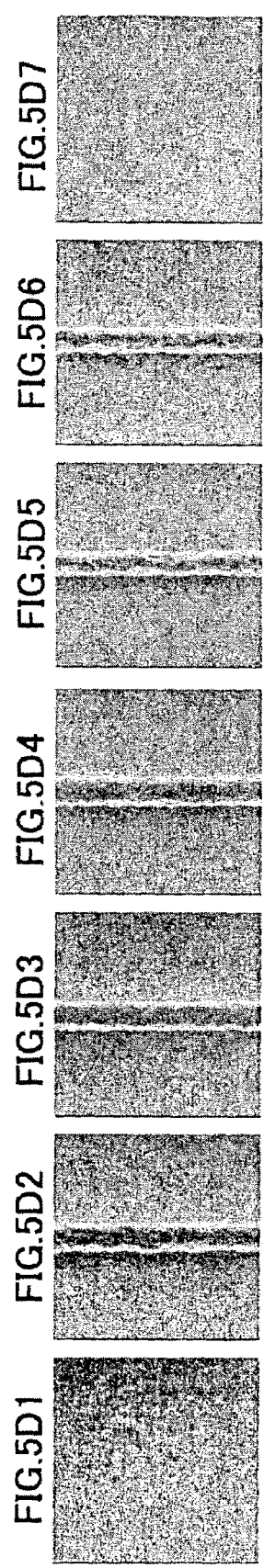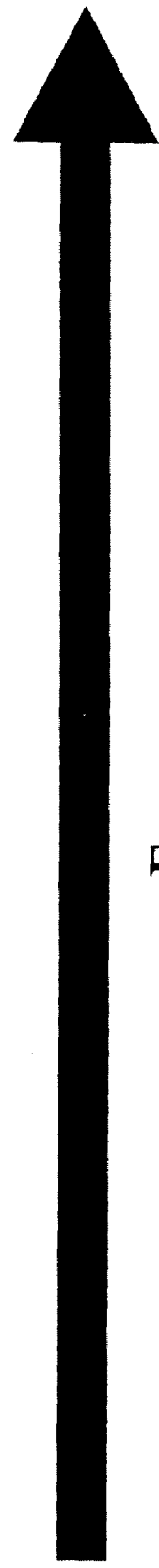

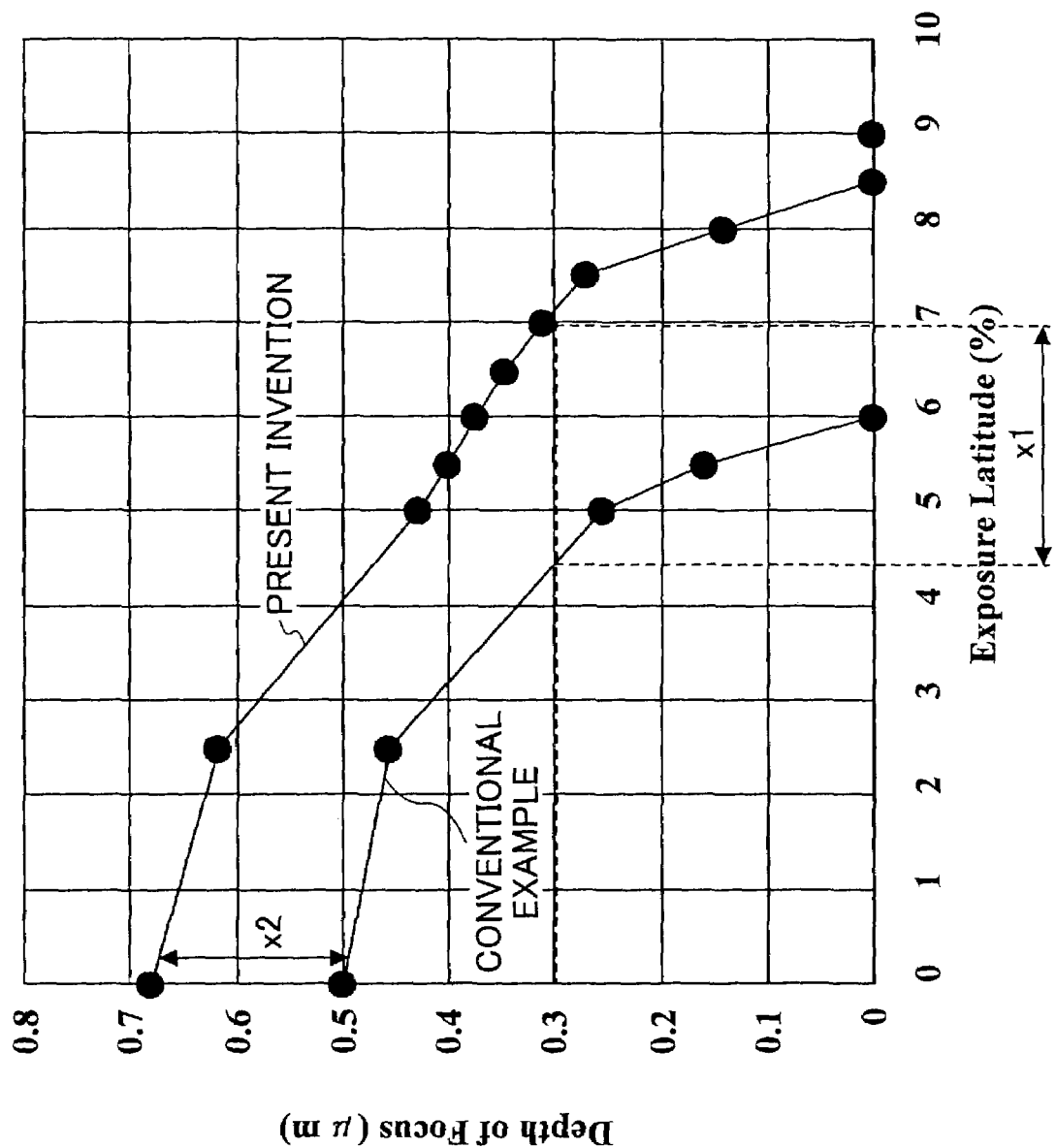

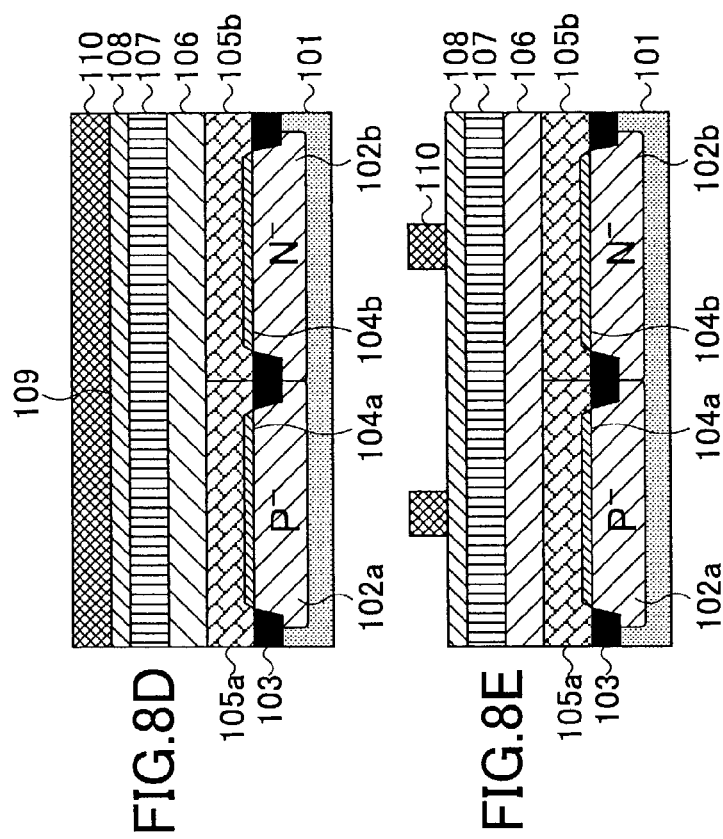
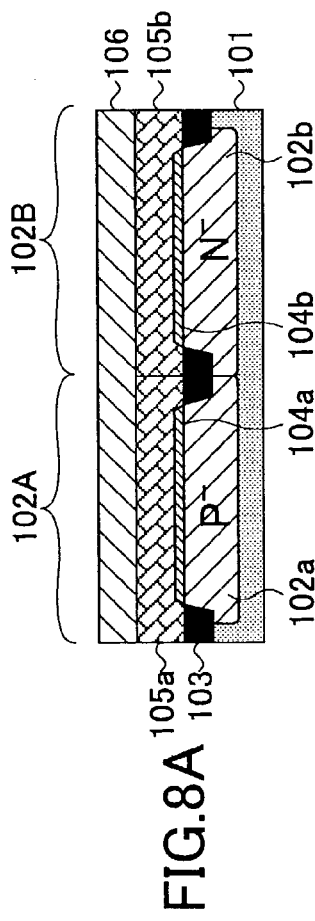
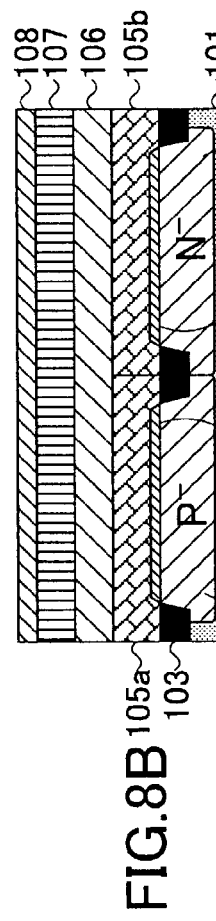
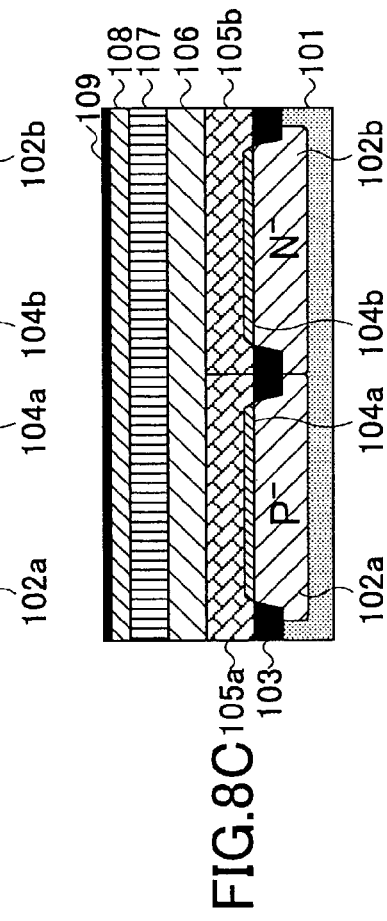

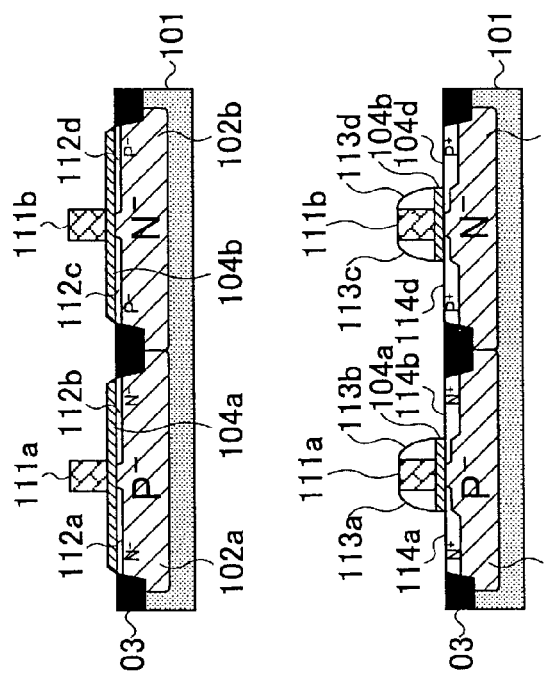
FIG.8I
FIG.8J
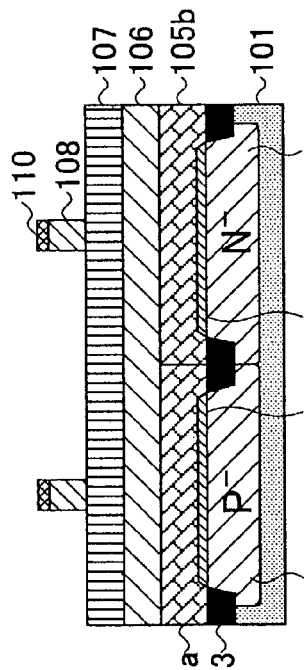
FIG.8F
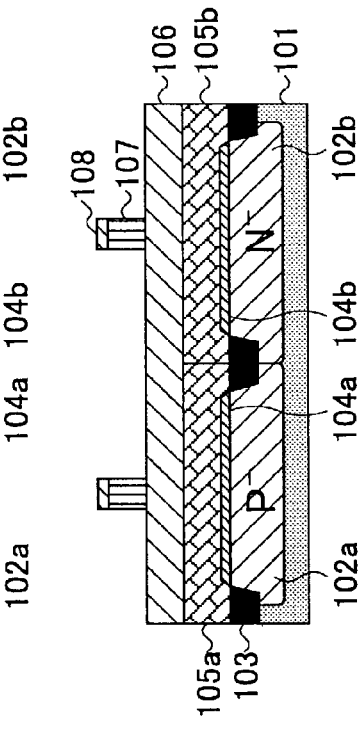
FIG.8G
FIG.8H

METHOD OF MANUFACTURING A SEMICONDUCTOR APPARATUS USING A SUBSTRATE PROCESSING AGENT

BACKGROUND OF THE INVENTION

1. Field of the Invention

The present invention generally relates to a method of manufacturing a semiconductor device, and more particularly to a patterning method using chemically amplified resist.

2. Description of the Related Art

In recent years, shortening the exposure wavelength in a lithographic process has advanced along with manufacturing semiconductor elements into microscopic sizes. KrF excimer lasers or ArF eximer lasers are now mainly employed as Deep-UV (DUV).

Compared to the conventional lithography process such as i-line lithography, the use of DUV as exposure wavelength has a problem of being easily subject to interference from substrate reflection. Therefore, such reflection and interference are often prevented by forming a reflection preventing film called BARC (Bottom Anti Reflective Coating) under the resist.

Further, the use of DUV often requires the employment of an exposure system of high numerical aperture for enhancing resolution. Therefore, obtaining sufficient focal depth would be difficult, and forming a thin layer resist would be a requirement. A method has been developed for solving the problem of etch resistance in a case of forming a thin layer resist, in which a film having a composition different from that of the resist is formed under the resist, and is used as a mask for etching.

Accordingly, employment of multi-layered resist is presently considered to be an effective technique.

Presently, a chemically amplified resist is typically used for enhancing resist resolution and sensitivity. A chemically amplified resist added with an acid generating agent which generates acid in the resist when exposed to light, creates further acid from catalytic reaction, and changes the resist to an alkali soluble molecular structure. This is a case of a positive type resist, but a negative type resist exists as well.

Using the chemically amplified resist, however, may change patterning size and resolution depending on the degree in the diffusion of acid. Patterning could, for example, be affected by acid or base formed in the resist interface.

For example, in a case of forming the BARC under the resist, some resist may experience defective formation called skirt trailing caused during pattern forming. Skirt trailing is a phenomenon where resist slantingly remains at a bottom portion of a pattern aimed for removal. This is a phenomenon where the acid generated by the acid generating agent contained in the resist is deactivated by the constituent inside the BARC.

A three layer process will hereinafter be described as an example of a process using a multi-layered resist. The three layer process is a method of, for example, forming an insulation film such as an SOG film under the resist, then forming a polymer film such as novolac resin under the aforementioned SOG film, and then forming a pattern upon a targeted processing film under the polymer film. That is, an insulating film is etched and patterned according to a pattern of a topmost resist formed thereon, then, a polymer film is etched using the insulating film as a mask, and then, an insulating film (e.g. silicon oxide film), which is a targeted processing film under the polymer film, is dry-etched to thereby transfer the pattern of the polymer film thereon. The polymer film being the bottom-most layer serves as the BARC for preventing reflection. In recent years, this method has become widely used since the topmost layer of resist can be formed into a thin layer.

Nevertheless, in the foregoing three layer process, similar to the foregoing case of using a BARC, the acid created by the chemically amplified resist formed on the top-most portion is deactivated by the constituent inside the SOG film serving as an underlayer beneath the chemically amplified resist, to thereby cause the aforementioned phenomenon of skirt trailing.

Therefore, in the current situation, adding of BARC or adding of acid generating agent to the SOG film is performed in order to supplement the deactivated acid and to adjust the formation of patterns.

However, in a case where an acid generating agent is added to a film serving as an underlayer for the resist, acid density will increase, for example, at the interface between the BARC and the resist, or at the interface between the SOG film and the resist, and furthermore, remaining acid would remove a protective group of the resin and become alkali soluble, to thereby cause a problem of intrusion at the resist interface. Using a negative type resist, on the other hand, faces problems such as skirt trailing at the bottom of the resist, or remaining of scum.

Furthermore, adding the acid generating agent to the SOG film may deteriorate the adhesiveness between the SOG film and the resist. Furthermore, the acid generated from the acid generating agent cannot be evenly distributed to the SOG film, and therefore, the pattern formed on a surface thereof could be scattered. Furthermore, the efficiency in the generation of acid may change since the amount of exposure changes in accordance with the coverage of a reticle, and therefore, optimizing the amount of the acid generating agent is extremely difficult. Furthermore, much time is required for adding and adjusting the acid generating agent to the SOG film when the resist is changed.

FIGS. 1A and 1B show an example where a resist pattern has collapsed when patterning with the three layer process of the foregoing conventional art. The patterns denoted as a and b in FIGS. 1A and 1B are separated from the substrate targeted for processing, to thereby cause a phenomenon called pattern-collapse. The remaining acid at the interface between the resist and the underlayer for the resist is considered to be the cause of this phenomenon.

It is therefore a general object to provide a method of manufacturing a semiconductor device for beneficially solving the aforementioned problems.

SUMMARY OF THE INVENTION

It is a general object of the present invention to provide a method of manufacturing a semiconductor device that substantially obviates one or more of the problems caused by the limitations and disadvantages of the related art.

Features and advantages of the present invention will be set forth in the description which follows, and in part will become apparent from the description and the accompanying drawings, or may be learned by practice of the invention according to the teachings provided in the description. Objects as well as other features and advantages of the present invention will be realized and attained by a method of manufacturing a semiconductor device particularly pointed out in the specification in such full, clear, concise, and exact terms as to enable a person having ordinary skill in the art to practice the invention.

To achieve these and other advantages and in accordance with the purpose of the invention, as embodied and broadly described herein, the invention provides a method of manufacturing a semiconductor device, including the steps of forming one or more insulation films over a substrate, said one or more insulation films including an insulation film at a top thereof, coating the insulation film with a substrate processing agent, providing resist onto the insulation film coated with the substrate processing agent, lithographically forming a pattern of the resist, and dry-etching the insulation film by using the resist as a mask, wherein the substrate processing agent contains at least a solvent and an acid generating agent.

By coating a substrate processing agent onto an insulation film serving as an underlayer disposed beneath resist, the present invention can prevent problems such as pattern collapse and resist separation caused upon coating resist onto the insulation film, and can therefore provide satisfactory patterning. The pattern collapse and the resist separation are caused by a remaining reaction of resist due to remaining acid at the interface between the insulation film and the resist being generated from the acid generating agent added to the insulation film and the resist. With the present invention, the insulation film is coated with a substrate processing agent being added with an acid generating agent for generating a weak acid, so that the remaining acid can be replaced by the weak acid so as to prevent the remaining acid from adversely affecting the patterning of resist and to enable satisfactory patterning.

Other objects and further features of the present invention will be apparent from the following detailed description when read in conjunction with the accompanying drawings.

BRIEF DESCRIPTION OF THE DRAWINGS

FIGS. 2A to 2I show a method of manufacturing a semiconductor device according to the present invention;

FIGS. 3A1 to 3B7 show patterns in a case where the focal point is changed under a condition where the line width and the line interval are 110 nm;

FIGS. 4A1 to 4B5 show patterns in a case where the exposure amount is changed under a condition where the line width and the line interval are 110 nm;

FIGS. 5C1 to 5C7 show isolated patterns in a case where the focal point is changed under a condition where the line width and the line interval are 125 nm;

FIG. 6 shows a process margin in a case where the line width and the line interval are 110 nm;

FIG. 7 shows a process margin in a case where the line width and the line interval are 125 nm;

FIGS. 8A to 8J show a method of manufacturing a semiconductor device according to the present invention.

DESCRIPTION OF THE PREFERRED EMBODIMENTS

Figure 1B:
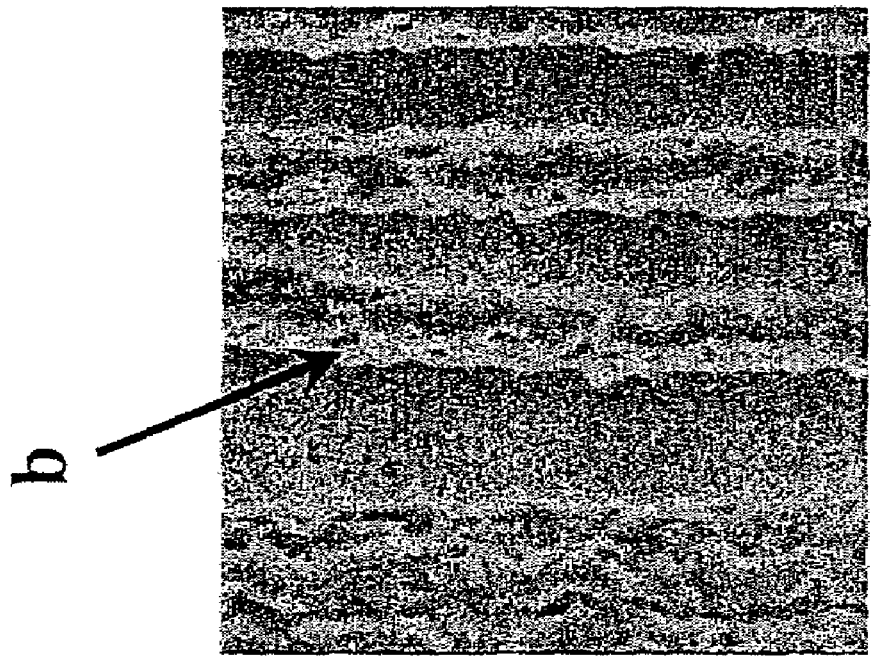
FIGS. 1A and 1B show an example of pattern collapse according to a conventional resist patterning method.

In the following, embodiments of the present invention will be described with reference to the accompanying drawings.

First Embodiment

A method of manufacturing a semiconductor device to which the present invention is applied will be described according to a processing order shown in FIGS. 2A to 2I.

In FIG. 2A, a silicon oxide film 10 is formed on a semiconductor substrate (not shown) having elements or the like formed thereto, and furthermore, a novolac resin 11, which is a polymer, is coated onto the silicon oxide film 10 with a spin-on method using a coater and is cured thereto, and furthermore, an SOG film 12, which is a non-organic film, is likewise coated onto the novolac resin 11 and thermally treated thereon. As mentioned above, the SOG film 12 has an acid generating agent added therein. Accordingly, the novolac resin 11 is formed above the silicon oxide film 10, and furthermore, the SOG film 12 is formed thereabove.

Next, in FIG. 2B, a substrate processing agent 13 of the present invention is coated onto the SOG film 12, and is uniformly spread onto the surface thereof by spinning. The substrate processing agent 13 is a solvent containing a basic material. Although a solvent such as thinner is conventionally used for coating at this stage, this invention instead uses the substrate processing agent 13 for coating. Therefore, no additional stage is required with respect to the conventional number of necessary stages. Furthermore, a coating efficiency enhancing effect (so-called "resist saving"), which is an effect obtainable by using the thinner as coating, may also be obtained by coating the resist immediately after this stage where the substrate processing agent 13 is not yet dry.

Next, in FIG. 2C, an ArF resist 14 is coated. This is a chemically amplified resist using an acid generating agent as a photosensitive agent.

Next, in FIG. 2D, exposure using an ArF exicimer laser is performed. At this stage, the ArF resist 14 and the acid generating agent inside the SOG film 12 create a photosensitive reaction and generate acid. In such a case, a weak acid is generated from the acid generating agent added to the substrate processing agent 13.

Next, in FIG. 2E, a heating process called PEB (Post Exposure Bake) is performed, to thereby cause diffusion of acid generated from the exposure. Conventionally, at this stage, acid generated from the acid generating agent of the SOG film would diffuse and separate out at the interface between the SOG film 12 and the resist 14, to thereby have an adverse effect on patterning, for example, cause pattern collapse during development of the resist 14.

However, since this invention coats the SOG film 12 with the substrate processing agent 13 so that a weak acid generated from the acid generating agent added to the substrate processing agent 13 replaces the remaining acid generated inside of the SOG film 12 or the resist 14, the adverse influence of the remaining acid can be eliminated, and a suitable pattern can be performed. In such a case, it is essential that the weak acid generated from the acid generating agent of the substrate processing agent 13 is an acid weaker than the acid supplied to the interface between the resist 14 and the SOG film 12 from the inside of the resist 14 or from the SOG film 14. Furthermore, the amount of the acid generating agent added to the substrate processing agent 13 is adjusted, so that the acid strength of the weak acid can be prevented from removing a protective group of the resist and becoming alkali soluble.

Next, in FIG. 2F, a developing process is performed, in which the conventional problem of pattern collapse does not occur, and patterning, on the other hand, can be performed suitably without any residue due to non-reaction caused by deactivation of acid.

Next, in FIG. 2G, patterning is performed on the SOG film 12 by a dry etching process using $CHF_3$ and $O_2$.

Next, in FIG. 2H, patterning is performed by etching the novolac resin 11 by a dry etching process using $H_2/O_2$. In such a case, the resist 14 having remained on the SOG film 12 is also etched.

In FIG. 2I, patterning is performed on the silicon oxide film 10 by dry etching with use of $CF_4$. In such a case, the SOG film 12 having remained on the novolac resin 11 is also etched. The last remaining novolac resin 11 is removed by ashing, to thereby complete the patterning of the silicon oxide film 10.

Accordingly, this invention is able to prevent poor patterning results and pattern collapse due to the influence of remaining acid and ensure suitable patterning by coating the SOG film with the substrate processing agent 13.

Conventionally, whenever the resist is changed, a corresponding SOG film was required to be formed. However, this embodiment can easily correspond to such change of resist by changing a binder of the substrate processing agent and adjusting the amount of the acid generating agent. This embodiment can also easily correspond to alteration in the coverage of a reticle by changing the amount of acid generating agent added to the substrate processing agent. Furthermore, since the acid generating agent can be evenly coated onto a surface of the SOG film or the like, unevenness in the pattern formed on the surface can be reduced.

In this invention, an optimum pattern can be formed by adjusting the acid strength of a weak acid generated from the acid generating agent where the solvent contained in the substrate processing agent ranges between 90% to 99.99%, and the acid generating agent contained in the substrate processing agent ranges between 0.01% to 10%. Used as the solvent is a mixed solution of PGMEA (propylene glycol monomethyl ether acetate) and PGME (propylene glycol monomethyl ether). Used as the acid generating agent of this embodiment is a photoacid generating agent in which the anion of the photoacid generating agent is triflate ($CF_3SO_3^-$), nonaflate ($C_4F_9SO_3^-$). Onium salt, disulfone, imidesulfonate, diazodisulfone or the like may also be employed as the photoacid generating agent.

Second Embodiment

As a second embodiment, an improved effect in preventing pattern collapse of resist upon forming a pattern will hereinafter be explained with reference to FIGS. 3A1 to 3B7, FIGS. 4A1 to 4B5, and FIGS. 5C1 to 5D7.

Figure 1A:
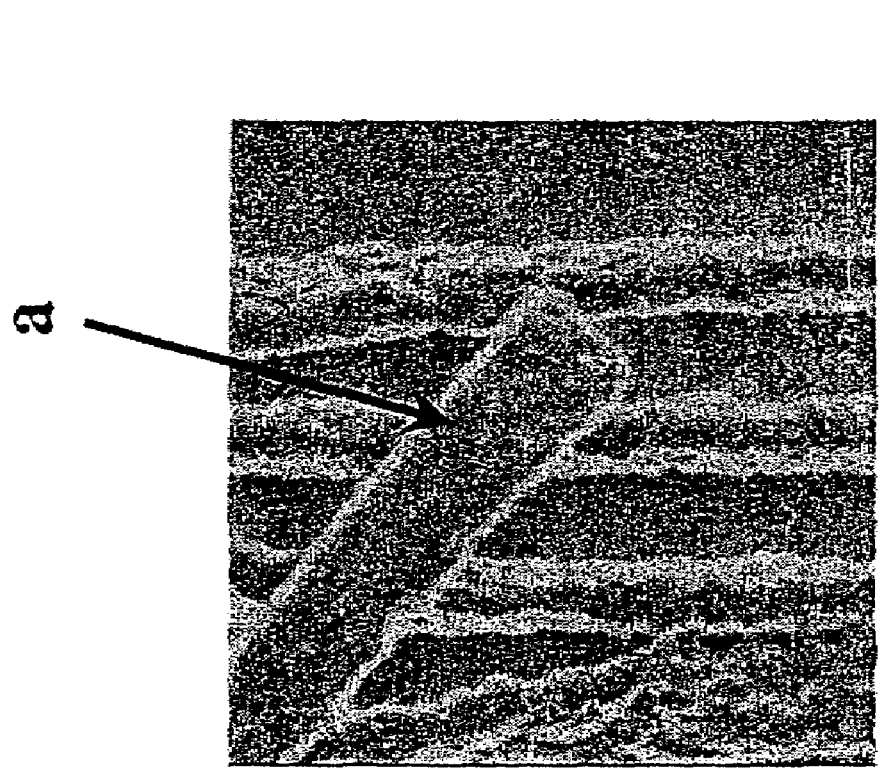
Figure 7:
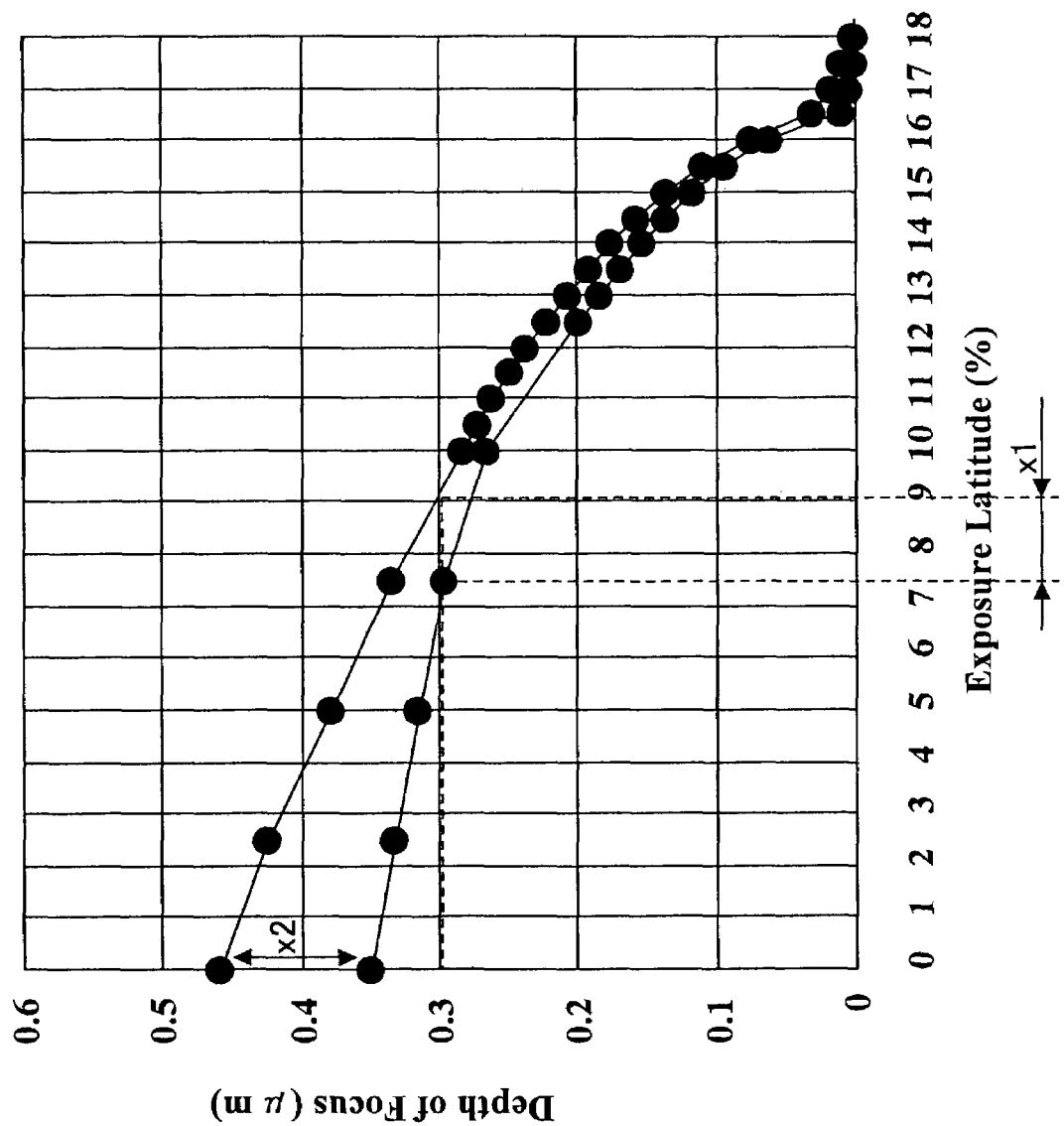

FIGS. 3A1 to 3B7 are photographs observed from an SEM (Scanning Electron Microscope) showing a resist pattern in which a line width and a line interval thereof are both 110 nm. FIGS. 3A1 to 3A7 show a resist pattern for a conventional example in a case where the focal point is changed with a step of 0.1μ, and FIGS. 3B1 to 3B7 show a resist pattern for the present invention using the substrate processing agent where the focal point is changed with a step of 0.1μ. In this case, FIG. 3A4 and FIG. 3B4 both show a state where the focal point is matched the most, i.e. a best focus state.

Although FIG. 3A4 shows the best focus state of the conventional example where no resist collapse can be found, FIGS. 3A1 to 3A3 and FIGS. 3A5 to 3A7 reveal problems such as resist pattern collapse, resist separation, and poor pattern formation.

Meanwhile, in the present invention using the substrate processing agent, poor pattern formation can be seen in FIG. 3B7; nevertheless, FIGS. 3B1 to 3B6 shows no resist separation, no poor pattern formation, but shows that the margin with respect to the focal point of exposure is widening.

FIGS. 4A1 to 4B5 are photographs observed from an SEM (Scanning Electron Microscope) showing a resist pattern in a case where the exposure time is changed. The line width and the line interval are both 110 nm.

FIGS. 4A1 to 4A5 show a resist pattern for a conventional example in a case where the exposure time (exposure amount) is changed, and FIGS. 4B1 to 4B5 show a resist pattern with use of the substrate processing agent of the present invention in a case where the exposure time (exposure amount) is changed. In this case, FIG. 4A3 and FIG. 4B3 both show a state where the exposure amount is best, i.e. a best dose state.

In the conventional example shown in FIGS. 4A1 to 4A5, a satisfactory pattern can be maintained from FIGS. 4A1 to 4A3; however, FIGS. 4A4 and 4A5 show pattern collapse in a so-called overdose state which is a state where the amount of exposure is excessive.

Meanwhile, except for a slight thinning of patterns shown in FIG. 4B4 and FIG. 4B5 due to overdose, the present invention using the substrate processing agent shown in FIGS. 4B1 to 4B5 has no problem such as pattern collapse and is able to provide satisfactory patterns. That is, using the substrate processing agent of the present invention widens the margin with respect for the exposure amount, and therefore patterns can easily be satisfactorily maintained.

FIGS. 5C1 to 5D7 show SEM (Scanning Electron Microscope) photographs of a resist pattern where the pattern is an isolated pattern.

FIGS. 5C1 to 5D7 show an isolated pattern having a line width of 125 nm subsequent to patterning.

FIGS. 5C1 to 5C7 show a resist pattern for a conventional example in a case where the focal point is changed with a step of 0.1μ, and FIGS. 5D1 to 5D7 show a resist pattern for the present invention using the substrate processing agent where the focal point is changed with a step of 0.1μ. In this case, FIG. 5C4 and FIG. 5D4 both show a state where the focal point is in a best focus state.

In the conventional example shown in FIGS. 5C1 to 5C7, the separation and complete loss of resist can be seen in FIG. 5C1, and resist collapse and resist separation can also be seen in FIG. 5C6 and FIG. 5C7.

Meanwhile, the present invention is able to provide a satisfactory pattern in the focus range between FIGS. 5D2 to FIG. 5D6, in which the pattern collapse in FIG. 5D6 can be improved compared to that of the conventional example. It can be seen that a widening effect of the process margin can be obtained for the isolated pattern as well.

Third Embodiment

Next, as a third embodiment, the effect of improving process margin upon forming a pattern will hereinafter be explained with reference to FIG. 6.

In FIG. 6, the lateral axis indicates a permissible value from the optimum exposure time, and the longitudinal axis indicates focal depth. It is to be noted that the line width and the line interval are both 110 nm in this case.

For example, in comparing the permissible amount from the optimum exposure time between the conventional example and the present invention under a condition where the focal depth is 0.3 micrometers, it can be seen that the permissible value for the conventional example being 4.5% is increased to 7.0% with the present invention, that the permissible amount is increased to an amount indicated as x1 in the drawing, and that the process margin is widened. Furthermore, as shown in x2 in the drawing, it can be seen that the focal depth of the conventional example being 0.5 micrometers is improved to approximately 0.7 micrometers with the present invention under a condition where the permissible value is 0.

FIG. 7 shows a result of an isolated pattern where the line width of the pattern is 125 nm.

With reference to FIG. 7, in comparing the permissible amount between the conventional example and the present invention under the same conditions in FIG. 6 where the focal depth is 0.3 micrometers, it can be seen that the permissible value for the conventional example being 7.5% is increased to 9.0% with the present invention, and that the permissible amount is increased to an improved amount indicated as y1 in the drawing. Furthermore, as shown in y2 in the drawing, it can be seen that the focal depth of the conventional example being 0.35 micrometers is improved to approximately 0.45 micrometers with the present invention under a condition where the permissible value is 0, and that the process margin is widened even though the improved effect may be less compared to when the line width and the line interval are 110 nm.

Fourth Embodiment

A process of manufacturing a semiconductor device using a semiconductor manufacturing method of the present invention will hereinafter be explained step by step with reference to FIGS. 8A to 8J. However, the same reference numerals are to be used for members corresponding to the above-mentioned members and the explanations thereof will be omitted.

FIGS. 8A to 8J are parts of a process for forming a CMOS element.

FIG. 8A shows an STI isolation structure 103 formed on a silicon substrate 101, in which an element region 102a is formed as a p⁻type by injection of a p-type impure element ion, and an element region 102b is formed as an n⁻type by injection of an n-type impure element ion. A thermal oxide film 104a and a thermal oxide film 104b are formed on the element region 102a and the element region 102b. A polysilicon 105a and polysilicon 105b are formed on the thermal oxide film 104a and the thermal oxide film 104b, respectively. An n-type impure element is injected into the polysilicon 105a, and a p-type impure element is injected into the polysilicon 105b.

As a hard mask for etching the polysilicon 105a and the polysilicon 105b, a silicon oxide film 106 is formed on the polysilicon 105a and the polysilicon 105b.

In the semiconductor device manufacturing method of the present invention, the silicon oxide film 106, as described in the first embodiment, is etched to form a pattern. The patterned silicon oxide film 106 then serves as a hard mask for etching the polysilicon 105a and the polysilicon 105b to form a gate electrode. Such process will hereinafter be described with reference to FIGS. 8B to 8J.

In FIG. 8B, a novolac resin 107 is coated and cured onto the silicon oxide 106, and then an SOG film 108 added with an acid generating agent is formed thereon by a spin-on method.

In FIG. 8C, a substrate processing agent 109 of the present invention, being added with an acid generating agent, is coated by a spin-on method so as to evenly and entirely coat thereon. Then, in FIG. 8D, an ArF resist 110 being a chemically amplified resist, is coated thereon, and exposure with ArF is performed. Then, as described above, a photosensitive reaction of the ArF resist 110 and the acid generating agent inside the SOG film 108 is created, to thereby generate acid. Although the generated acid diffuses in the PEB (Post Exposure Bake) heating process, the present invention is able to perform acid replacement in which a weak acid generated from the acid generating agent inside the substrate processing agent 109 coated onto the SOG film 108 serves to replace the remaining acid generated from the ArF resist 110 and the acid generating agent inside the SOG film 108, so that the adverse influence of the remaining acid can be prevented.

Therefore, in performing a subsequent process of developing shown in FIG. 8E, problems such as separation of resist patterns and collapse of patterns can be prevented, and patterning can be performed satisfactorily.

In FIG. 8F, the SOG film 108 is patterned by a dry-etching process using $CHF_3$ and $O_2$.

In FIG. 8G, the novolac resin 107 is patterned by a dry-etching process using $H_2/O_2$. In this process, the resist 110 remaining on the SOG film 108 is also etched.

Tn FIG. 8H, the silicon oxide film 106 is patterned by a dry-etching process using $CF_4$. In this process, the SOG film 108 remaining on the novolac resin 107 is also etched.

In FIG. 8I, using the patterned silicon oxide film 106 as a mask, the polysilicon 105a and the polysilicon 105b are etched, to thereby form a gate electrode 111a and a gate electrode 111b.

Further, the gate electrode 111a and the gate electrode 111b are used as masks for injecting a p-type impure element ion into the element region 102a, and for injecting an n-type impure element ion into the element region 102b, via the thermal oxide films 104a and 104b. Accordingly, n-type diffusion regions 112a and 112b are formed in the element region 102a, and p-type diffusion regions 112c and 112d are formed in the element region 102b.

Next, in FIG. 8J, sidewall insulation films 113a and 113b are formed on the sides of the gate electrode 111a, and sidewall insulation films 113c and 113d are formed on the sides of the gate electrode 111b.

Next, the gate electrode 111a and sidewall insulation films (sidewall oxide film) 113a and 113b serve as masks for injecting the n-type impure ion into the element region 102a, to thereby activate the element region 102a. Accordingly, $n^+$type diffusion regions 114a and 114b are formed at a portion of the element region 102a toward an outer portion of the sidewall oxide film.

Likewise, the gate electrode 111b and sidewall insulation films (sidewall oxide film) 113c and 113d serve as masks for injecting the p-type impure ion into the element region 102b, to thereby activate the element region 102b. Accordingly, $p^+$type diffusion regions 114c and 114d are formed at a portion of the element region 102b toward an outer portion of the sidewall oxide films 113c and 113d.

Accordingly, coating the SOG film 108 with the substrate processing agent 109 of the present invention will allow prevention of poor pattern formation and pattern collapse due to remaining acid and enable satisfactory patterning of gate electrodes even in a case of forming a high speed semiconductor device of considerable microscopic size with a gate length less than 0.1 micrometers.

Fifth Embodiment

Next, a fifth embodiment of the present invention will be explained. As explained below, the semiconductor device manufacturing method of the present invention may also be applied to etching an insulating film when forming a damascene structure in a wiring process.

Figure 9:
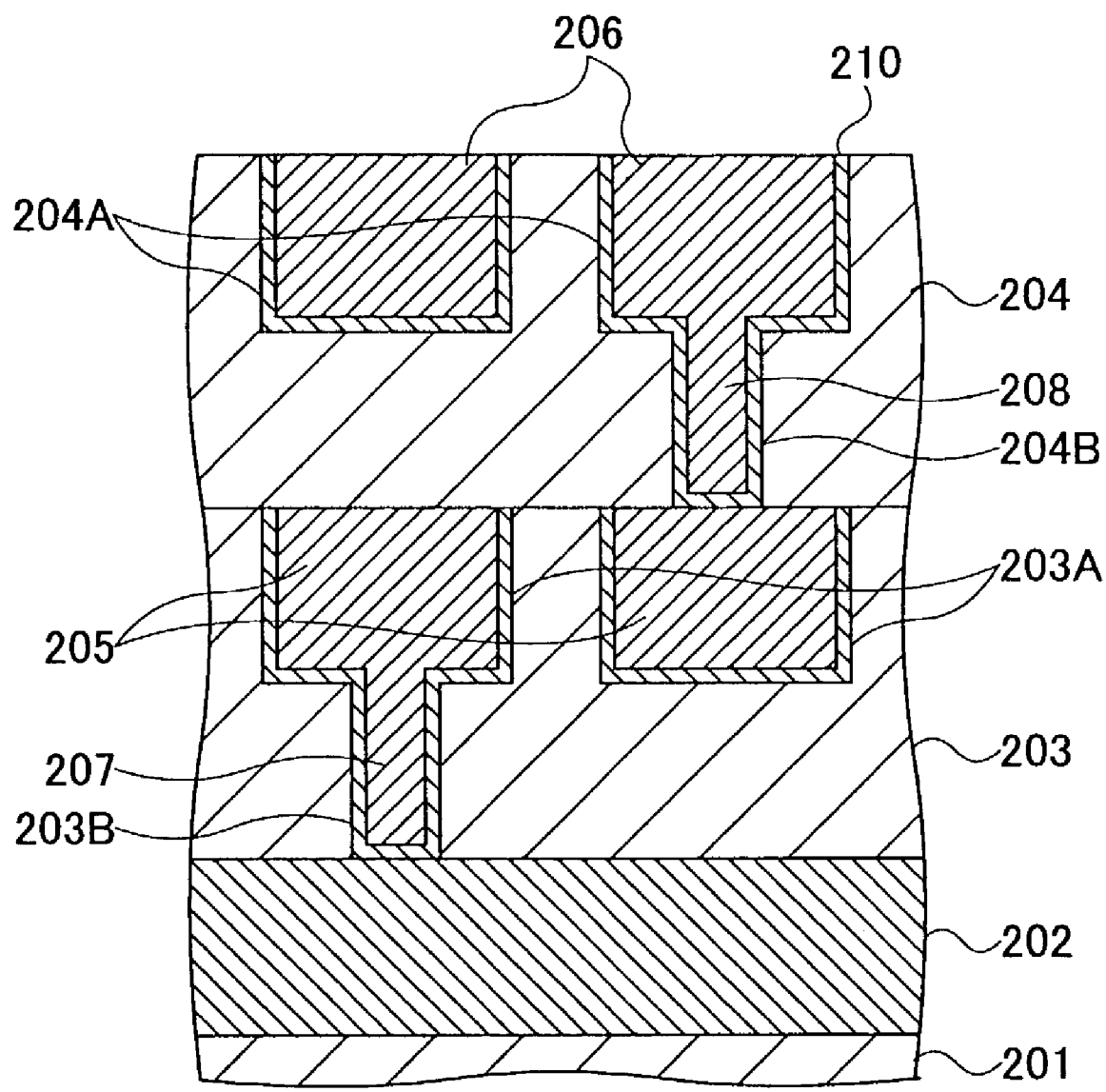
FIG. 9 shows a semiconductor device manufactured by employing a method of manufacturing a semiconductor device according to the present invention.

FIG. 9 shows a portion of a semiconductor device 200 formed by using the semiconductor device manufacturing method of the present invention.

In FIG. 9, an insulation film 201, such as a silicon oxide film is formed in a manner covering an element (not shown)

such as a MOS transistor formed on a silicon semiconductor substrate. A wiring layer formed of W or the like (not shown) is electrically connected to such element, and connected thereto is a wiring layer 202 formed of Cu or the like.

A first insulation layer 203 and a second insulation layer 204 both formed on the wiring layer 202 have a wiring groove portion 203A and a wiring groove portion 204A formed therein, respectively. The wiring groove portions 203A and 204A have Cu wires 205 and 206 formed therein, respectively. A hole portion 203B and a hole portion 204B are formed in the first insulation layer 203 and the second insulation layer 204, respectively. The hole portion 203B and a hole portion 204B have Cu contacts 207 and 208 formed therein. A barrier layer 210 is formed at the periphery of the Cu wires 205 and 206, and the Cu contacts 207 and 208.

The semiconductor device manufacturing method of the present invention could be applied for etching and patterning the first insulation layer 203 and the second insulation layer 204 of the semiconductor device 200. For example, the patterning method of the present invention could be applied in a case of forming the wiring groove portion 203A and the hole portion 203B for the first insulation layer 203, and also in a case of forming the wiring groove portion 204A and the hole portion 204B for the first insulation layer 204.

The patterning method in the first embodiment can be employed by forming an inorganic based film (e.g. silicon oxide film) on the first insulation layer 203 and the second insulation layer 204 as a mask in a case where the first insulation layer 203 and the second insulation layer 204 are an organic based film such as an organic SOG film (e.g. MSQ, porous MSQ), a fluorine added carbon film, a SiCo film, a SiCo (H) film, or a SiCH film.

Further, direct etching can be performed with the method in the first embodiment in a case where the first insulation layer 203 and the second insulation layer 204 are an inorganic based film such as a silicon oxide film, an inorganic SOG film (e.g. an HSQ film, a porous HSQ film), or a porous $SiO_2$ film.

The semiconductor device manufacturing method of the present invention is described as a method where a substrate processing agent is coated onto an underlayer for resist in the foregoing embodiments, deposition using a CVD method (chemical vapor deposition) could also be performed with a film other than the SOG film as the underlayer for resist. Further, the same effect can be obtained in a case where a BARC is used as an underlayer for resist by coating the surface of the BARC with the substrate processing agent of the present invention. Besides coating onto or spinning onto the BARC serving as a resist underlayer for antireflection, the same effect can be obtained with the present invention also in a case where an anti reflective film called BARL (Bottom Anti Reflective Layer) is formed by a CVD method.

By coating an insulation film with a substrate processing agent, the present invention can prevent problems such as pattern collapse and resist separation caused upon coating resist onto the insulation film, and can therefore provide satisfactory patterning. The pattern collapse and the resist separation are caused by a remaining reaction of resist due to remaining acid at the interface between the insulation film and the resist being generated from the acid generating agent added to the insulation film and the resist. With the present invention, the insulation film is coated with a substrate processing agent being added with an acid generating agent for generating a weak acid, so that the remaining acid can be replaced by the weak acid so as to prevent the remaining acid from adversely affecting the patterning of resist and to enable satisfactory patterning.

Further, the present invention is not limited to these embodiments, but various variations and modifications may be made without departing from the scope of the present invention.

The present application is based on Japanese priority application No.2002-242075 filed on Aug. 22, 2002 with the Japanese Patent Office, the entire contents of which are hereby incorporated by reference.

What is claimed is:

1. A method of manufacturing a semiconductor device, comprising the steps of:
    forming one or more insulation films over a substrate, said one or more insulation films including an insulation film at a top thereof;
    coating the insulation film with a substrate processing agent;
    providing resist onto the insulation film coated with the substrate processing agent;
    lithographically forming a pattern of the resist; and
    dry-etching the insulation film by using the resist as a mask,
    wherein the substrate processing agent contains at least a solvent and an acid generating agent,
    wherein the solvent ranges between 90% to 99.99% of the substrate processing agent, wherein the acid generating agent ranges between 0.0 1% to 10% of the substrate processing agent
    wherein the acid generating agent generates an acid with an acid strength weaker than an acid strength of an acid supplied to an interface between the resist and the insulation film from the resist or from the insulation film.

2. The method of manufacturing a semiconductor device according to claim 1, wherein the solvent of the substrate processing agent is a mixed solution of PGMEA (propylene glycol monomethyl ether acetate) and PGME (propylene glycol monomethyl ether).

3. The method of manufacturing a semiconductor device according to claim 1, wherein the acid generating agent is a photoacid generating agent having an anion of triflate ($CF_3SO_3^-$) or nonaflate ($C_4F_9SO_3^-$).

4. The method of manufacturing a semiconductor device according to claim 1, wherein the acid generating agent is a photoacid generating agent formed of onium salt, disulfone, imidesulfonate, or diazodisulfone.

5. The method of manufacturing a semiconductor device according to claim 1, wherein the acid generated from the acid generating agent has an acid strength thereof adjusted for preventing a reaction of removing a protective group of the resist.

6. The method of manufacturing a semiconductor device according to claim 1, wherein the step of coating the substrate processing agent and the step of providing the resist are performed consecutively.

7. The method of manufacturing a semiconductor device according to claim 1, wherein the resist is a chemically amplified resist which generates acid when exposed to light.

8. The method of manufacturing a semiconductor device according to claim 1, wherein the insulation film has an acid generating agent added therein.

9. The method of manufacturing a semiconductor device according to claim 1, wherein the insulation film is formed on the substrate by a spin-on method.

10. The method of manufacturing a semiconductor device according to claim 1, wherein the insulation film is dry-etched with an etching gas containing a gas of a fluorine compound.

11. The method of manufacturing a semiconductor device according to claim 1, further comprising dry-etching a second insulation film immediately beneath the top insulation film by using the top insulation film at the top as a mask.

12. The method of manufacturing a semiconductor device according to claim 11, wherein the second insulation film is a film formed of polymer.

13. The method of manufacturing a semiconductor device according to claim 12, wherein the polymer is a resin formed of novolac.

14. The method of manufacturing a semiconductor device according to claim 11, wherein the second insulating film is dry-etched with a gas containing hydrogen and oxygen.

15. The method of manufacturing a semiconductor device according to claim 11, further comprising dry-etching a third insulation film immediately beneath the second insulation film by using the second insulation film as a mask.

16. The method of manufacturing a semiconductor device according to claim 15, wherein the third insulation film is a film formed of a silicon compound.

17. The method of manufacturing a semiconductor device according to claim 16, wherein the silicon compound is formed as a silicon oxide film.

18. A method of manufacturing a semiconductor device, comprising the steps of:
   forming one or more insulation films over a substrate, said one or more insulation films including an insulation film at a top thereof;
   coating the insulation film with a substrate processing agent;
   providing resist onto the insulation film coated with the substrate processing agent;
   lithographically forming a pattern of the resist; and
   dry-etching the insulation film by using the resist as a mask,
   wherein the substrate processing agent contains at least a solvent and an acid generating agent,
   wherein the solvent ranges between 90% to 99.99% of the substrate processing agent, wherein the acid generating agent ranges between 0.01% to 10% of the substrate processing agent, and
   wherein the insulation film has an acid generating agent added therein.

19. The method of manufacturing a semiconductor device according to claim 18, wherein the solvent of the substrate processing agent is a mixed solution of PGMEA (propylene glycol monomethyl ether acetate) and PGME (propylene glycol monomethyl ether).

20. The method of manufacturing a semiconductor device according to claim 18, wherein the acid generating agent of the substrate processing agent is a photoacid generating agent having an anion of triflate ($CF_3SO_3^-$) or nonaflate ($C_4F_9SO_3^-$).

21. The method of manufacturing a semiconductor device according to claim 18, wherein the acid generating agent of the substrate processing agent is a photoacid generating agent formed of onium salt, disulfone, imidesulfonate, or diazodisulfone.

22. The method of manufacturing a semiconductor device according to claim 18, wherein the acid generating agent of the substrate processing agent generates an acid with an acid strength weaker than an acid strength of an acid supplied to an interface between the resist and the insulation film from the resist or from the insulation film, and
   wherein the acid generated from the acid generating agent of the substrate processing agent has an acid strength thereof adjusted for preventing a reaction of removing a protective group of the resist.

23. The method of manufacturing a semiconductor device according to claim 18, wherein the step of coating the substrate processing agent and the step of providing the resist are performed consecutively.

24. The method of manufacturing a semiconductor device according to claim 18, wherein the resist is a chemically amplified resist which generates acid when exposed to light.

25. The method of manufacturing a semiconductor device according to claim 18, wherein the insulation film is formed on the substrate by a spin-on method.

26. The method of manufacturing a semiconductor device according to claim 18, wherein the insulation film is dry-etched with an etching gas containing a gas of a fluorine compound.

27. The method of manufacturing a semiconductor device according to claim 18, further comprising dry-etching a second insulation film immediately beneath the top insulation film by using the top insulation film at the top as a mask.

28. The method of manufacturing a semiconductor device according to claim 27, wherein the second insulation film is a film formed of polymer.

29. The method of manufacturing a semiconductor device according to claim 28, wherein the polymer is a resin formed of novolac.

30. The method of manufacturing a semiconductor device according to claim 27, wherein the second insulating film is dry-etched with a gas containing hydrogen and oxygen.

31. The method of manufacturing a semiconductor device according to claim 27, further comprising dry-etching a third insulation film immediately beneath the second insulation film by using the second insulation film as a mask.

32. The method of manufacturing a semiconductor device according to claim 31, wherein the third insulation film is a film formed of a silicon compound.

33. The method of manufacturing a semiconductor device according to claim 32, wherein the silicon compound is formed as a silicon oxide film.

* * * * *